United States Patent
Krishnamurthy et al.

(10) Patent No.: US 9,513,658 B2
(45) Date of Patent: Dec. 6, 2016

(54) MULTI-BIT FLIP-FLOP REORGANIZATION TECHNIQUES

(71) Applicant: Apple Inc., Cupertino, CA (US)

(72) Inventors: Harsha Krishnamurthy, San Jose, CA (US); Muthukumaravelu Velayoudame, Fremont, CA (US)

(73) Assignee: Apple Inc., Cupertino, CA (US)

( * ) Notice: Subject to any disclaimer, the term of this patent is extended or adjusted under 35 U.S.C. 154(b) by 131 days.

(21) Appl. No.: 14/641,619

(22) Filed: Mar. 9, 2015

(65) Prior Publication Data

US 2016/0266604 A1 Sep. 15, 2016

(51) Int. Cl.
*G06F 1/10* (2006.01)
*G06F 1/14* (2006.01)
*G06F 17/50* (2006.01)
*H03K 19/00* (2006.01)

(52) U.S. Cl.
CPC . *G06F 1/10* (2013.01); *G06F 1/14* (2013.01); *G06F 17/5022* (2013.01); *G06F 17/5031* (2013.01); *H03K 19/0016* (2013.01)

(58) Field of Classification Search
CPC .......... G06F 1/10; G06F 1/14; G06F 17/5022; G06F 17/5031; H03K 19/0016
See application file for complete search history.

(56) References Cited

U.S. PATENT DOCUMENTS

| | | | |
|---|---|---|---|
| 7,549,139 B1 | 6/2009 | Tuan et al. | |
| 8,051,396 B2 | 11/2011 | Beerel et al. | |
| 8,271,922 B2 | 9/2012 | Zahn et al. | |
| 8,615,727 B2* | 12/2013 | Ghanta | G06F 17/5031 716/134 |
| 9,135,375 B1* | 9/2015 | Sood | G06F 17/50 |
| 9,280,614 B1* | 3/2016 | Sood | G06F 17/50 |
| 9,411,912 B1* | 8/2016 | Sood | G06F 17/50 |
| 2003/0192020 A1* | 10/2003 | Collins, Jr. | G06F 17/5031 716/136 |
| 2012/0159414 A1* | 6/2012 | Ghanta | G06F 17/5031 716/113 |
| 2013/0297278 A1 | 11/2013 | Narayanaswamy et al. | |
| 2014/0149956 A1* | 5/2014 | Fluhr | G06F 17/5031 716/113 |

* cited by examiner

*Primary Examiner* — M Elamin
*Assistant Examiner* — Abdelmoniem Elamin
(74) *Attorney, Agent, or Firm* — Meyertons, Hood, Kivlin, Kowert & Goetzel, P.C.; Gareth M. Sampson; Lawrence J. Merkel

(57) ABSTRACT

A process utilized in an integrated circuit design methodology may be used to assess and organize individual bits (e.g., flip-flops) within multi-bit clocked storage devices (e.g., multi-bit flip-flops) for use in the integrated circuit design. The process may include assessing timing slacks of the bits, sorting and/or assigning the bits based on the assessed timing slacks, and remapping the multi-bit clocked storage devices using the sorted and/or assigned bits. One or more timing corrections may be applied to the remapped multi-bit clocked storage devices. The timing corrections may include useful clock skewing or resizing (e.g., upsizing or downsizing) of the remapped multi-bit clocked storage devices.

20 Claims, 5 Drawing Sheets

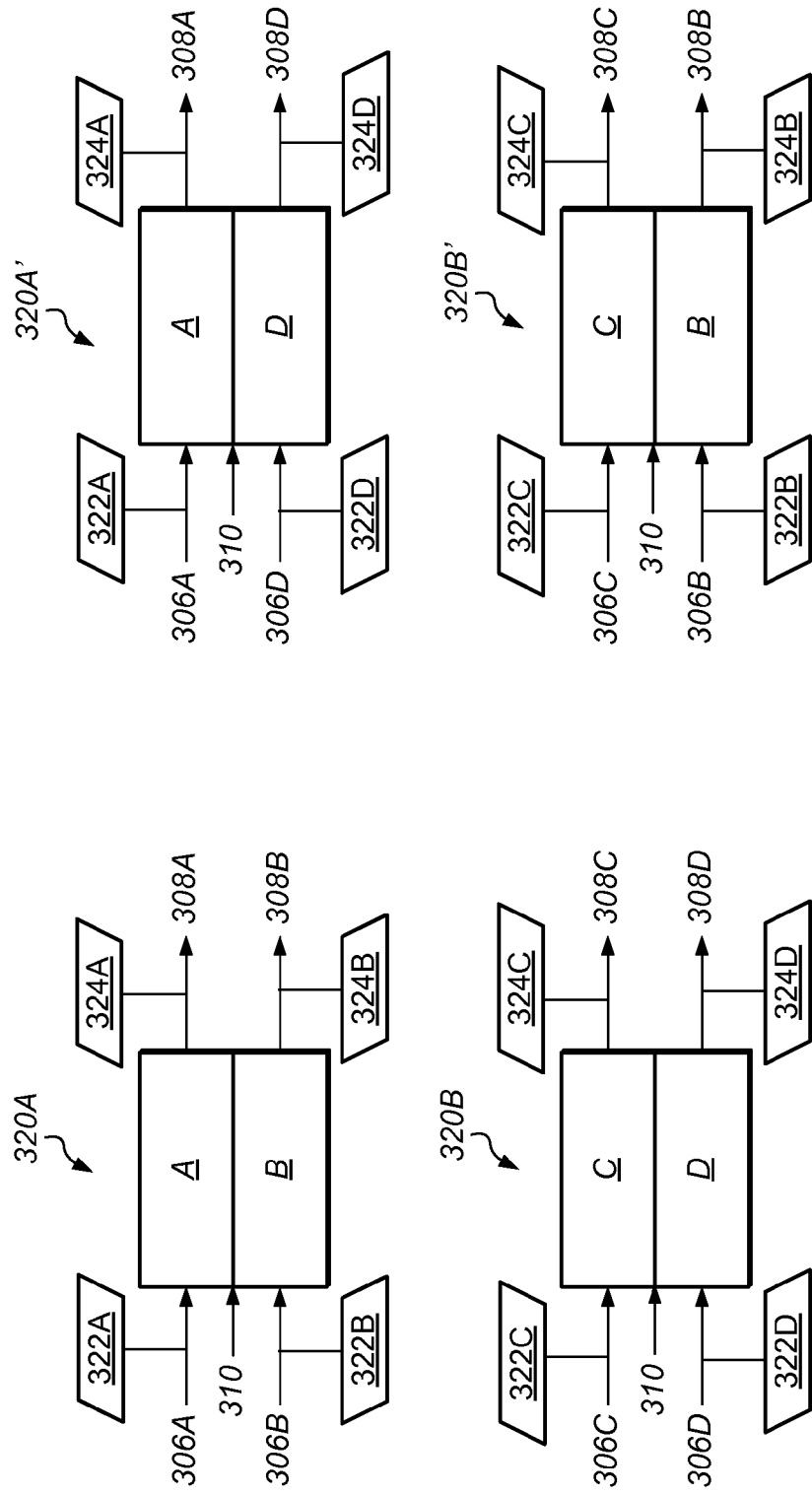

MULTI-BIT FLIP-FLOP REORGANIZATION TECHNIQUES

BACKGROUND

1. Technical Field

Embodiments described herein relate to integrated circuit layouts and designs. More particularly, embodiments described herein relate to the use of multi-bit flip-flops in the integrated circuit layouts and designs and methods for assessing timing slack properties of the multi-bit flip-flops and organizing individual flip-flops within the multi-bit flip-flops for use in the integrated circuit layouts and designs.

2. Description of Related Art

Multiple bit (multi-bit) flip-flops (flip-flops with 2, 4, or even 8 bits per flop) and/or other multi-bit clocked storage devices are commonly used in current low power integrated circuit (IC) designs to primarily lower clock dynamic power (clock switching power). Multi-bit flip-flops (multi-bit flops) reduce clock dynamic power by implementing multiple individual flip-flops in a single large flip-flop with shared clock circuitry. Multi-bit flops are introduced using logic synthesis tools with multiple sequential states being mapped to each multi-bit flop (for example, depending on whether it is 2, 4, or 8 bits). During physical design (place and route), the timing slacks on each of the input and output pins of multi-bit flops can be vastly different.

Useful clock skewing is a well known method of adjusting the clock latencies to flip-flops (either delaying or advancing the clock) to help improve the speed of the IC design (for example, by rebalancing/redistributing timing slack across flip-flops). There should be timing slack on at least one (either input or output) side of a flip-flop to perform useful clock skewing. When multi-bit flops are present, the opportunity to perform useful clock skewing is limited by the difference in timing slack between the data (input) and its corresponding output pin timing slacks for multiple bits across the flip-flop. By adjusting the clock going into multi-bit flops, slacks for multiple input-output pin pairs are affected.

The cell size for multi-bit flops are primarily determined by the worst timing slack on any of the input (for setup) or output (for launch path) pins and by the drive strength required for the worst load on any of the multi-bit flop's output pins. The cell size of multi-bit flops determine sequential and clock power. Therefore, reducing multi-bit flop cell sizes may help reduce overall power significantly.

When a single-bit flip-flop is driving a large load (fanout), the single-bit flip-flop is typically upsized to drive the large load. Sequential duplication (flip-flop duplication) is typically used to split the large load between multiple the flip-flops. In sequential duplication, the single-bit flip-flop is replicated and the total load is distributed between the duplicate single-bit flip-flops (either based on load or timing slack). When single-bit flip-flops are duplicated in such a manner, the clock power needed increases since multiple clock fanout points are introduced in the IC design. Thus, higher switching clock power and larger clock drivers are need to drive the duplicate single-bit flip flops and the large load.

SUMMARY

In certain embodiments, a process, included in an integrated circuit design methodology, is used to assess timing slacks, sort and/or assign bits (e.g., individual flip-flops) based on the assessed timing slacks, and remap multi-bit clocked storage devices (e.g., multi-bit flip-flops) using the sorted and/or assigned bits. One or more timing corrections may be applied to the remapped multi-bit clocked storage devices. In some embodiments, applying the timing correction includes providing useful clock skewing on the remapped multi-bit clocked storage devices. In some embodiments, applying the timing correction includes resizing (e.g., upsizing or downsizing) the remapped multi-bit clocked storage devices as needed. In some embodiments, a single input may be provided to a multi-bit clock-storage device and the outputs of the multi-bit clocked storage device may be used to distribute the load on the multi-bit clocked storage device.

BRIEF DESCRIPTION OF THE DRAWINGS

Features and advantages of the methods and apparatus of the embodiments described in this disclosure will be more fully appreciated by reference to the following detailed description of presently preferred but nonetheless illustrative embodiments in accordance with the embodiments described in this disclosure when taken in conjunction with the accompanying drawings in which:

FIG. 5 depicts a representation of an embodiment of two multi-bit flip-flops.

FIG. 6 depicts a representation of an embodiment of two remapped multi-bit flip-flops.

Figure 1:
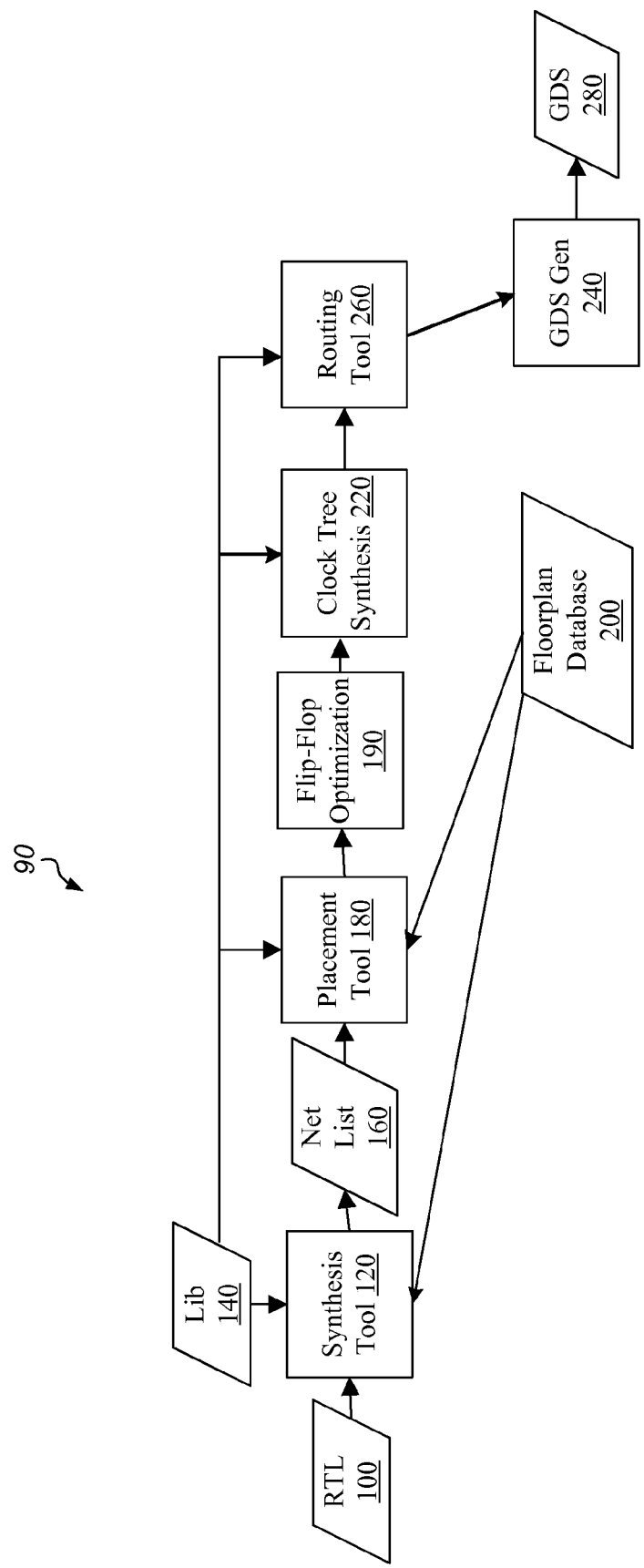
FIG. 1 depicts an embodiment of a block diagram illustrating a methodology for designing an integrated circuit.

While the embodiments described in this disclosure may be susceptible to various modifications and alternative forms, specific embodiments thereof are shown by way of example in the drawings and will herein be described in detail. The drawings may not be to scale. It should be understood that the drawings and detailed description thereto are not intended to limit the embodiments to the particular form disclosed, but to the contrary, the intention is to cover all modifications, equivalents and alternatives falling within the spirit and scope of the appended claims.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. §112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION OF EMBODIMENTS

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Turning now to FIG. 1, a block diagram illustrating one embodiment of a methodology for designing an integrated circuit is depicted. Methodology 90 begins with a register transfer level (RTL) description of the logic of the integrated circuit (reference numeral 100). The RTL description 100 is input to a synthesis tool 120, which also has access to a library 140 of predesigned circuit "cells". In certain embodiments, these cells include flip-flops such as single-bit flip-flops or multi-bit flip-flops. The RTL description 100 may be expressed in any hardware description language (HDL) such as Verilog, Very High Speed Integrated Circuit Hardware Description Language (VHDL), etc. The RTL description 100 may be a behavioral level description if the synthesis tool 120 is a behavioral synthesis tool. The output of the synthesis tool 120 may be a net list 160, which may be a list of instances of the cells from the library 140 and the connection between the cell instances that realizes the RTL description 100. The connection may be expressed using the same signal name between a given output pin of a cell (e.g., a flip-flop cell) and the input pin(s) of other cells to which the output pin is connected. The net list 160 may further include instances of a custom circuit design created by the designer and not included in the library 140 for general use. The custom circuits may be directly instantiated in the RTL 100 and may not be changed by the synthesis tool 120. Additionally, a floorplan database 200 may be developed with a floorplan database tool (not shown). The floorplan database 200 may be developed, for example, based on the blocks into which the integrated circuit is divided and their expected areas and/or geometric shape on the integrated circuit.

Additionally, a floorplan database 200 may be developed with a floorplan database tool (not shown). The floorplan database 200 may be developed, e.g., based on the blocks into which the integrated circuit is divided and their expected areas and/or geometric shape on the integrated circuit.

The net list 160 and the floorplan database 200 may be input to a placement tool 180, which may determine a physical arrangement of the cells/circuits (including flip-flop cells) on the surface of a semiconductor substrate which will form the integrated circuit when manufactured. The placement tool 180 may receive description from the library 140 of the size of each cell (x and y directions) and the location of input and output pins on each cell (e.g., input and output pins on flip-flop cells). The placement tool 180 may take into account which pins of each cell instance are coupled to which pins of other cell instances in making the placement, as well as the overall dimensions of the integrated circuit (or the block within the integrated circuit, if the RTL description 100 is for less than the entire integrated circuit). The placement tool 180 may assign a placement location of standard cells and saves the assigned placement location in the physical design database (e.g., annotating placement information—location co-ordinates and cell orientation for each standard cell).

In certain embodiments, the cells include clocked storage devices and the placement tool 180 includes clocked storage device optimization 190. A clocked storage device may be any storage device that is configured to capture input data in response to a clock and to store the input data until the next clock. Additionally, the clocked storage device may be configured to transmit (or "launch") the stored data on the output of the device responsive to the clock as well. In certain embodiments, the clocked storage device is a multi-bit clocked storage device. Examples of multi-bit clocked storage devices include, but are not limited to, multi-bit flip-flops, multi-bit latches, multi-bit registers, and other multi-bit sequential elements.

In some embodiments, clocked storage device optimization 190 includes assessing properties of the clocked storage devices and remapping of input and output pins to the clocked storage devices. For multi-bit clocked storage devices, remapping may include remapping individual clocked storage device input/output pins between different multi-bit clocked storage devices. In some embodiments, clocked storage device optimization 190 includes applying timing corrections to one or more cells.

The physical design database 200 may have information of placement of standard cells, floorplan information, macro cells, and/or power grid may be passed on to clock tree synthesis 220. Clock tree synthesis 220 may insert and resize cells for clock distribution and update the physical design database 200. Clock tree synthesis 220 may route the clock nets in the design. The clock tree synthesis tool may synthesize the clock circuits for the integrated circuit and may insert them into the physical design database 200.

The physical design database 200 as updated by the clock tree synthesis tool 220 may be input to the routing tool 260 (or more simply "router" 260). In some embodiments, the router (260) may generate descriptions of the metal layers for the integrated circuit, connecting output pins to input pins as specified by the net list 160. The output of the routing tool 260 may further update the physical design database 200. Once the design is complete, the updated physical design database 200 may be ultimately provided to a graphic data system (GDS) generator 240, which may generate the GDS description 280 of the integrated circuit. The GDS description 280 may be transmitted to the foundry that manufactures the integrated circuit. The information in the GDS description 280 may be used for mask fabrication and other processing at the foundry to produce the integrated circuit.

The router 260 may generally determine the routing for each net specified in the net list 160. A net may be one conductor on which a signal output by a cell/circuit is communicated to one or more input pins of one or more other cells/circuits. The net may include multiple end points (one output and multiple inputs, or even multiple output pins if the cells are controlled to avoid contention). The net may also include conductors at more than one metal layer in the integrated circuit, as well as vias between the layers, etc. The conductors may also be referred to as wires.

Figure 2:
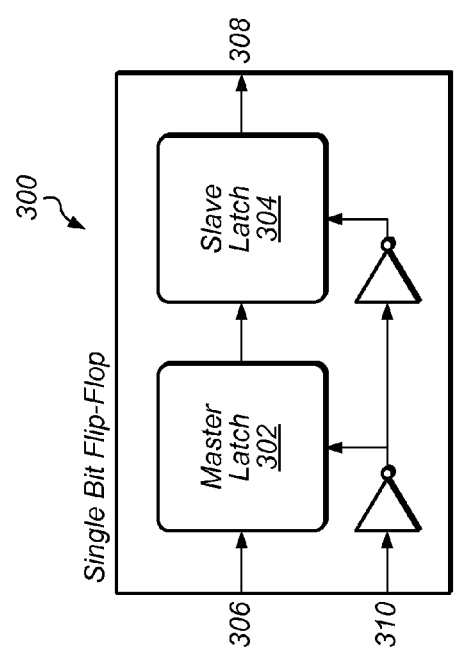
FIG. 2 depicts a representation of an embodiment of a single bit flip-flop.

FIG. 2 depicts a representation of an embodiment of a single bit flip-flop. In certain embodiments, single bit flip-flop 300 ("single bit flop 300") includes a single master latch 302 and a single slave latch 304 provided with a single input 306 (e.g., a data or "D" input) and a single output 308 (e.g., a "Q" output). Single bit flop 300 may have single logical clock input 310 (e.g., single logical clock gating logic).

Figure 3:
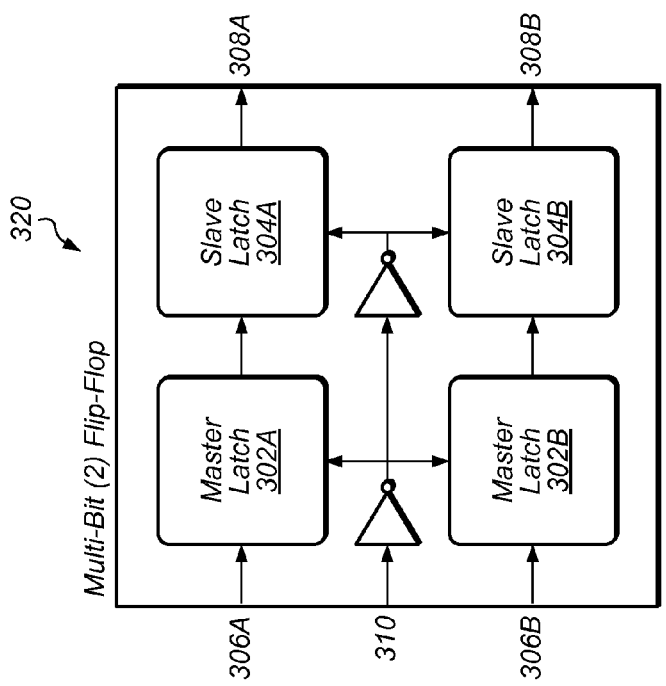
FIG. 3 depicts a representation of an embodiment of a multi-bit flip-flop.

FIG. 3 depicts a representation of an embodiment of a multi-bit flip-flop. In certain embodiments, multi-bit flip-flop 320 ("multi-bit flop 320") includes two master latches 302A and 302B and two slave latches 304A and 304B with master latch 302A and slave latch 304A being a first set of latches (e.g., a first bit) and master latch 302B and slave latch 304B being a second set of latches (e.g., a second bit). In some embodiments, each bit has its own set of input and output. For example, master latch 302A and slave latch 304A may have input 306A and output 308A while master latch 302B and slave latch 304B may have input 306B and output 308B. In certain embodiments, both bits (e.g., both sets of latches) have a single, common logical clock input 310. Thus, clock input 310 is provided to both bits within multi-bit flop 320. It is to be understood that while FIG. 3 depicts an embodiment of multi-bit flop 320 with 2 bits (e.g., 2 sets of latches or 2 individual flip-flops) that the number of bits (and inputs/outputs) may be varied as desired with a single, common logical clock input coupled to all the bits within the multi-bit flop. For example, multi-bit flop may include 3, 4, or 5 bits with the single, common logical clock input coupled to all the bits.

Figure 4:
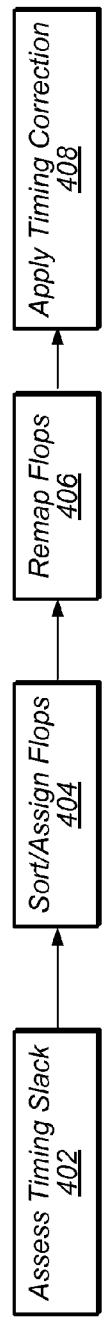
FIG. 4 depicts a flowchart of an embodiment of a process for clocked storage device optimization of multi-bit flip flops.

FIG. 4 depicts a flowchart of an embodiment of a process for clocked storage device optimization of multi-bit flip flops in the methodology for designing an integrated circuit depicted in FIG. 1. For example, process 400 may be used for clocked storage device optimization 190 in FIG. 1. It is to be understood that while the process depicted in the flowchart of FIG. 4 and related embodiments (e.g., embodiments depicted in FIGS. 5-9) are directed to optimization of multi-bit flops that such disclosure may also be applied to other multi-bit clocked storage devices without departing from the spirit and scope of the disclosed embodiments. For example, one of ordinary skill would recognize that the process depicted in the flowchart of FIG. 4 and related embodiments may be applied to other multi-bit clocked storage devices such as multi-bit latches, multi-bit registers, and other multi-bit sequential elements.

As shown in FIG. 4, process 400 may begin with "Assess Timing Slack 402". In 402, one or more timing slack properties of the input pins and the output pins for a plurality of multi-bit flip-flops may be assessed. In certain embodiments, assessing the timing slack properties includes assessing the timing slack properties for the input pins and the output pins on individual flip-flops (e.g., individual bits) in the plurality of multi-bit flip-flops (e.g., multi-bit clocked storage devices). In certain embodiments, assessing the timing slack properties includes assessing a negative or positive timing slack for the pin and/or a relative magnitude of the timing slack for the individual flip-flops.

FIG. 5 depicts a representation of an embodiment of two multi-bit flip-flops 320A, 320B with assessed timing slack properties. For simplicity, only 2 multi-bit flops with 2 input/outputs per flop (e.g., 2 bit multi-bit flip-flops) are shown in FIG. 5. A person of skill in the art would understand that the number of multi-bit flops in the optimization may vary (e.g., the number of multi-bit flops would likely be much larger) and the number of bits (e.g., individual flip-flops) per multi-bit flop may also vary. Multi-bit flop 320A and multi-bit flop 320B may have single, common logical clock input 310.

In certain embodiments, the timing slack properties of inputs 306A-D (e.g., the input pins) and outputs 308A-D (e.g., the output pins) are assessed for multi-bit flop 320A and multi-bit flop 320B. The assessed timing slacks in FIG. 5 may be: timing slack 322A for input 306A; timing slack 322B for input 306B; timing slack 322C for input 306C; timing slack 322D for input 306D; timing slack 324A for output 308A; timing slack 324B for output 308B; timing slack 324C for output 308C; and timing slack 324D for output 308D.

After 402, in certain embodiments, the individual flip-flops (e.g., flip-flops with corresponding inputs/outputs (such as "A" input/output or "B" input/output pairs) in multi-bit flop 320A and multi-bit flop 320B) are sorted and/or assigned based on their assessed timing slack properties in "Sort/Assign Flops 404", as shown in FIG. 4. In 404, in certain embodiments, the individual flip-flops are sorted into a selected order based on their assessed timing slack properties. Sorting the individual flip-flops into the selected order may include sorting the individual flip-flops based on one or more selected timing slack properties.

In some embodiments, the individual flip-flops are sorted into the selected order based on a single timing slack property. For example, the individual flip-flops may be sorted into the selected order based on the relative magnitudes of the timing slack of their outputs (e.g., from most positive timing slack to most negative timing slack). In some embodiments, the individual flip-flops are sorted into the selected order based on a combination of timing slack properties. For example, the individual flip-flops may be sorted into the selected order based on the combination of relative magnitude and direction (negative or positive) of both the inputs and the outputs. In such a sorting order, adjacent individual flip-flops are the individual flip-flops having magnitudes and directions for both the input and the output timing slacks that are the same or the closest to being the same among the timing slack properties assessed in 402. Thus, adjacent individual flip-flops in the selected order may have related (common) timing slack properties.

In certain embodiments of 404, the individual flip-flops are assigned to a flip-flop group (e.g., a flip-flop cluster or a bit group) that is selected from a plurality of flip-flop groups (e.g., bit groups). In some embodiments, the individual flip-flops are assigned to the flip-flop groups after sorting the individual flip-flops. In some embodiments, the individual flip-flops are sorted and remapped (described below) without assigning the individual flip-flops to flip-flop groups. In some embodiments, the individual flip-flops are assigned to the flip-flop groups and remapped (described below) without sorting the individual flip-flops.

In certain embodiments, the plurality of flip-flop groups includes flip-flop groups that have been selected such that each flip-flop group will have one or more common (or related) timing slack properties among the individual flip-flops in the group. The number, size, and distribution of flip-flop groups may be selected as desired based on the characteristics of the integrated circuit design and/or the characteristics of the multi-bit flip-flops used in the integrated circuit design. In addition, the characteristics of each flip-flop group may be selected as desired based on, for example, a desired optimization result (e.g., remapping and/or timing correction result described below) for the multi-bit flip-flops.

In embodiments where the individual flip-flops are assigned to the flip-flop groups after sorting the individual flip-flops, the flip-flop groups may be selected by dividing the sorted, selected order of individual flip-flops into the desired number of flip-flop groups. In embodiments where the individual flip-flops are assigned to the flip-flop groups without sorting the individual flip-flops, the flip-flop groups may be selected based on an assessment of the timing slack properties assessed in 402 and the desired number of flip-flop groups.

In one embodiment, each flip-flop group may have individual flip-flops with both the inputs and the outputs having substantially similar timing slack properties. In such an embodiment, the individual flip-flops in each group are the individual flip-flops having magnitudes and directions for both the input and the output timing slacks that are the same or the closest to being the same (e.g., "substantially similar") among the assessed timing slacks of the individual flip-flops. Thus, for an integrated circuit design using 2-bit multi-bit flip-flops, each group may include two individual flip-flops that are the closest (e.g., most similar) associated pairs of input/outputs among the assessed timing slacks. In embodiments where the individual flip-flops are assigned to the flip-flop groups after sorting the individual flip-flops, the two individual flip-flops that are the closest associated pairs would be individual flip-flops that are adjacent in the sorted, selected order.

In another embodiment, each flip-flop group may have individual flip-flops with either the inputs or the outputs having substantially similar magnitudes and/or directions in their timing slack properties. In such an embodiment, the individual flip-flops in the group are the individual flip-flops that can be grouped most closely based independently on either their input timing slack properties or their output timing slack properties. Thus, the group (or cluster) of individual flip-flops may be a group of individual flip-flops with the inputs (or outputs) all having a common (or related) timing slack property. For example, the individual flip-flops may be grouped based on the relative magnitudes of the timing slack of their outputs (e.g., a group may include a selected number of individual flip-flops having the most negative timing slacks). As further example, for an integrated circuit design using 2-bit multi-bit flip-flops, each group may include two individual flip-flops that have the same or the closest output timing slacks (in magnitude and direction) among the assessed timing slacks. In embodiments where the individual flip-flops are assigned to the flip-flop groups after sorting the individual flip-flops, the two individual flip-flops that are selected for the group would be individual flip-flops that are adjacent in the sorted, selected order.

After the individual flip-flops are sorted and/or assigned in 404, the multi-bit flip-flops (e.g., multi-bit flops 320A, 320B depicted in FIG. 5) may be remapped (or re-ordered) in "Remap Flops 406", as shown in FIG. 4. Remapping the multi-bit flip-flops may include moving wires (e.g., "rewiring") for the individual flip-flops in the integrated circuit design to provide multi-bit flip flops with individual flip-flops having desired timing slack properties in each multi-bit flip flop. In certain embodiments, the multi-bit flip-flops are remapped to provide each multi-bit flip flop with a different flip-flop group of individual flip-flops having common timing slack properties. In some embodiments, the multi-bit flip-flops are remapped to provide each multi-bit flip flop with individual flip-flops that are adjacent to each other in the sorted, selected order of individual flip-flops (e.g., the multi-bit flip flops are remapped based on the sorted, selected order of individual flip-flops).

In certain embodiments, the individual flip-flops that are remapped into each multi-bit flop (e.g., the individual flip-flops assigned to each flip-flop group) are within a pre-determined radius of each other in the integrated circuit design before remapping. In some embodiments, the sorting and/or assigning the individual flip-flops in 404 is also done with the pre-determined radius used as a factor in the sorting/assigning. For example, adjacent pairs of individual flip-flops and/or individual flip-flops in a flip-flop group must be within the pre-determined radius of each other. Thus, the sorting, assigning, and remapping of the individual flip-flops is "placement aware". Limiting grouping (or clustering) of individual flip-flops for each remapped multi-bit flop to individual flip-flops within the pre-determined radius may simplify the remapping (rewiring) process and reduce the likelihood of the remapped integrated circuit design becoming too complex for integration into a process for producing the integrated circuit. In addition, if the individual flip-flops for each remapped multi-bit flop are too far away from each other (e.g., outside the pre-determined radius), the wiring to remap the individual flip-flops may be have longer lengths, which increases wire resistance inside the integrated circuit design and may slow down processing speeds.

After remapping the multi-bit flip-flops in 406, one or more timing corrections may be applied to the multi-bit flip-flops in "Apply Timing Correction 408", as shown in FIG. 4. Examples of timing corrections that may be applied to the multi-bit flops include, but are not limited to, useful clock skewing and resizing (e.g., upsizing or downsizing the multi-bit flip-flop). Useful clock skewing may be applied to the multi-bit flip-flops to adjust clock latencies to the flip-flops and improve the speed of the integrated circuit design. Resizing of the multi-bit flip-flops may be used to better utilize power in the integrated circuit design. In the present disclosure, resizing may be considered a timing correction as the decision on whether to resize a multi-bit flip-flop is based on the timing slack properties of the multi-bit flip-flop.

The timing correction(s) may be applied to all of the multi-bit flip-flops or only a selected number of multi-bit flip-flops depending on the properties of the remapped multi-bit flip-flops and/or a desired optimization of the multi-bit flops. For example, if the timing correction is useful clock skewing, a multi-bit flip-flop may not need useful clock skewing if the multi-bit flip-flop has a small or negligible timing slack. In certain embodiments, the timing corrections in 408 are applied during clocked storage device optimization 190, shown in FIG. 1. In some embodiments, the timing corrections in 408 may be applied during clock tree synthesis 220.

In certain embodiments, process 400, shown in FIG. 4, is used to remap multi-bit flip-flops for useful clock skewing. Useful clock skewing may be provided on remapped multi-bit flip-flops using multi-bit flop 320A and multi-bit flop 320B, depicted in FIG. 5, as an example of two multi-bit flip-flops before remapping. The timing slack properties of inputs 306A-D (e.g., the input pins) and outputs 308A-D (e.g., the output pins) are assessed for multi-bit flop 320A and multi-bit flop 320B during step 402 in process 400, shown in FIG. 4. For the useful clock skewing example, the assessed timing slacks are: −5 ps (picoseconds) for timing slack 322A; 10 ps for timing slack 322B; 5 ps for timing slack 322C; −10 ps for timing slack 322D; 10 ps for timing slack 324A; −5 ps for timing slack 324B; −5 ps for timing slack 324C; and 10 ps for timing slack 324D.

With the above examples of timing slacks on multi-bit flop 320A and multi-bit flop 320B, useful clock skewing may not be provided for multi-bit flop 320A and/or multi-bit flop 320B because of the differences in the timing slacks within each multi-bit flop. However, multi-bit flop 320A and multi-bit flop 320B may be remapped to allow useful clock skewing to be provided and improve the speed of an integrated circuit design using the multi-bit flops.

Based on the assessed timing slacks provided in the example above, the individual flip-flops (e.g., flip-flops with corresponding inputs/outputs (such as "A" input/output pair, "B" input/output pair, "C" input/output pair, and "D" input/output pair) in multi-bit flop 320A and multi-bit flop 320B may be sorted and/or assigned (in, for example, step 404 in process 400) to allow for remapping of the multi-bit flops. To provide useful clock skewing, input/output pair "A" (individual flip-flop "A") may be grouped with input/output pair "D" (individual flip-flop "D") and input/output pair "B" (individual flip-flop "B") may be grouped with input/output pair "C" (individual flip-flop "C") based on the above listed timing slack values.

After sorting/assigning the individual flip-flops, multi-bit flop 320A and multi-bit flop 320B may be remapped (in, for example, step 406 in process 400) according to the above groups of individual flip-flops to provide multi-bit flop 320A' and multi-bit flop 320B', shown in FIG. 6. After remapping, multi-bit flop 320A' includes individual flip-flop "A" and individual flip-flop "D" while multi-bit flop 320B' includes individual flip-flop "B" and individual flip-flop "C". Remapping the multi-bit flops, as shown in FIG. 6, provides multi-bit flop 320A' and multi-bit flop 320B' with timing slack properties that are suitable for useful clock skewing. For example, multi-bit flop 320A' has input pins (306A, 306D) with timing slacks of −5 ps and −10 ps and output pins (308A, 308D) with timing slacks of 10 ps and 10 ps. Thus, the logical clock input 310 for multi-bit flop 320A' can be delayed by 10 ps to provide useful clock skewing.

Multi-bit flop 320B', however, has input pins (306B, 306C) with timing slacks of 5 ps and 10 ps and output pins (308B, 308C) with timing slacks of −5 ps and −5 ps. Thus, the logical clock input 310 for multi-bit flop 320B' can be sped up by 5 ps to provide useful clock skewing.

As described above, process 400, shown in FIG. 4, may be used to assess timing slacks, sort/assign individual flip-flops based on the assessed timing slacks, remap multi-bit flip-flops using the sorted/assigned individual flip-flops, and provide useful clock skewing on the remapped multi-bit flip-flops. By providing useful clock skewing on remapped multi-bit flip-flops, process 400 provides an optimized process that increases speed and improves performance for an integrated circuit design.

In certain embodiments, process 400, shown in FIG. 4, is used to remap multi-bit flip-flops for resizing. Resizing may be provided on remapped multi-bit flip-flops using multi-bit flop 320A and multi-bit flop 320B, depicted in FIG. 5, as an example of two multi-bit flip-flops before remapping. The timing slack properties of inputs 306A-D (e.g., the input pins) and outputs 308A-D (e.g., the output pins) are assessed for multi-bit flop 320A and multi-bit flop 320B during step 402 in process 400, shown in FIG. 4. For the resizing example, the assessed timing slacks are: 5 ps (picoseconds) for timing slack 322A; 10 ps for timing slack 322B; 15 ps for timing slack 322C; 20 ps for timing slack 322D; 10 ps for timing slack 324A; −10 ps for timing slack 324B; −5 ps for timing slack 324C; and 10 ps for timing slack 324D.

Resizing (either upsizing or downsizing) multi-bit flop 320A and/or multi-bit flop 320B using the above examples of timing slacks may not be an efficient method for upsizing or downsizing the multi-bit flops because each multi-bit flop has both a negative output timing slack and a positive output timing slack. The multi-bit flops may be upsized for the worst load but there is no opportunity for downsizing (power consumption reduction). However, multi-bit flop 320A and multi-bit flop 320B may be remapped to allow resizing to be provided in an efficient manner and improve power utilization in the integrated circuit design.

Based on the assessed timing slacks provided in the example above, the individual flip-flops (e.g., flip-flops with corresponding inputs/outputs (such as "A" input/output pair, "B" input/output pair, "C" input/output pair, and "D" input/output pair) in multi-bit flop 320A and multi-bit flop 320B may be sorted and/or assigned (in, for example, step 404 in process 400) to allow for remapping of the multi-bit flops. To provide mapping for efficient resizing, the most positive output timing slacks (timing slacks 324A and 324D) and the most negative output timing slacks (timing slacks 324B and 324C) may be groupled, clustered, or paired together. Thus, input/output pair "A" (individual flip-flop "A") may be grouped with input/output pair "D" (individual flip-flop "D") and input/output pair "B" (individual flip-flop "B") may be grouped with input/output pair "C" (individual flip-flop "C") based on the above listed timing slack values.

Figure 7:
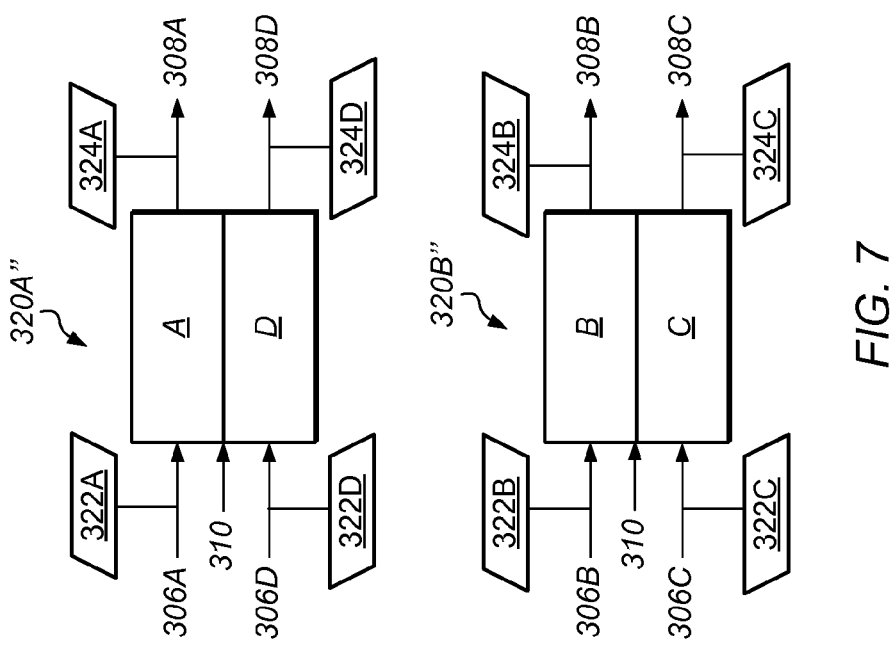
FIG. 7 depicts a representation of another embodiment of two remapped multi-bit flip-flops.

After sorting/assigning the individual flip-flops, multi-bit flop 320A and multi-bit flop 320B may be remapped (in, for example, step 406 in process 400) according to the above groups of individual flip-flops to provide multi-bit flop 320A" and multi-bit flop 320B", shown in FIG. 7. After remapping, multi-bit flop 320A" includes individual flip-flop "A" and individual flip-flop "D" while multi-bit flop 320B" includes individual flip-flop "B" and individual flip-flop "C". Remapping the multi-bit flops, as shown in FIG. 7, provides multi-bit flop 320A" and multi-bit flop 320B" with timing slack properties that allow efficient resizing of the multi-bit flops. For example, multi-bit flop 320A" has output pins (308A, 308D) with timing slacks of 10 ps and 10 ps and multi-bit flop 320B" has output pins (308B, 308C) with timing slacks of −10 ps and −5 ps.

With multi-bit flop 320A" and multi-bit flop 320B" remapped as shown in FIG. 7, multi-bit flop 320A" may be downsized to reduce its power consumption while multi-bit flop 320B" may be upsized as needed (e.g., in a worst load scenario). The remapping shown in FIG. 7 provides a multi-bit flop layout that allows resizing to be done efficiently in the integrated circuit design, thereby controlling and reducing power consumption in an efficient manner.

In some embodiments, process 400 may be used remap multi-bit flops and group (cluster) together output pins with similar loads. Grouping output pins with similar loads together may provide multi-bit flops that do not need to be upside, thus improving power usage efficiency by inhibiting power waste due to upsizing.

Figure 8:
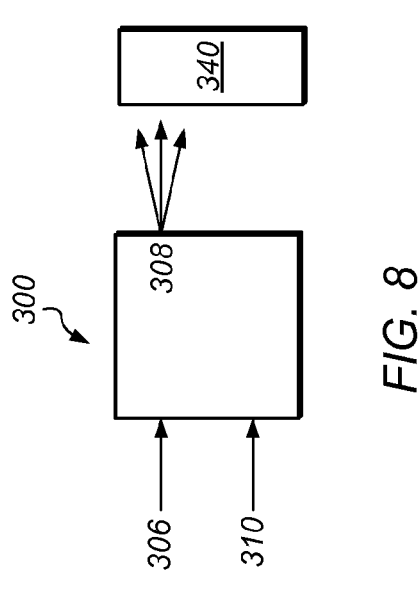
FIG. 8 depicts a representation of an embodiment of a single-bit flop driving a large (fanout) load

In certain embodiments, a multi-bit flip-flop is used to drive a large load more efficiently than a single-bit flip-flop. FIG. 8 depicts a representation of an embodiment of single-bit flop 300 driving a large (fanout) load. Because single-bit flop 300 is driving large load 340 through single output 308, single-bit flop 300 typically needs to be upsized to be able to drive the large load, thus increasing power consumption in the integrated circuit.

Figure 9:
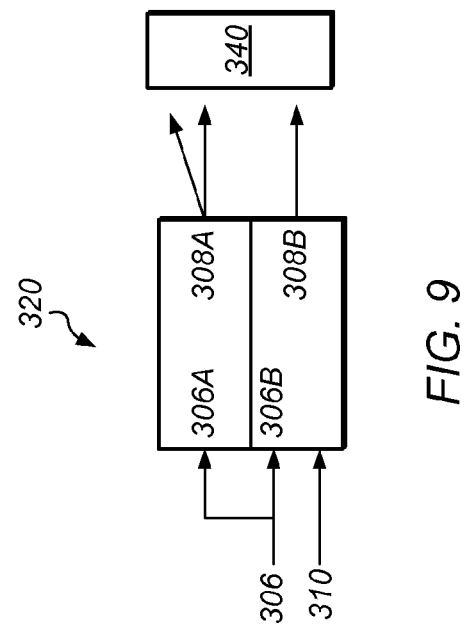
FIG. 9 depicts a representation of an embodiment of a multi-bit flop driving a large load.

FIG. 9 depicts a representation of an embodiment of multi-bit flop 320 driving large load 340. In certain embodiments, input 306A and input 306B on multi-bit flop 320 are connected (shorted) so that a single input is provided to multi-bit flop 320 (e.g., input 306 for the single-bit flop is split into input 306A and input 306B). With the single input provided to multi-bit flop 320, the output to large load 340 may be split between output 308A and output 308B, distributing the large load between the outputs on the multi-bit flop. Thus, the load driven by each individual flip-flop in multi-bit flop 320 is reduced without increasing the clock power provided to the multi-bit flop.

In some embodiments, multi-bit flop 320, depicted in FIG. 9, has been remapped using process 400, depicted in FIG. 4. In some embodiments, multi-bit flop 320, depicted in FIG. 9, may be downsized if the loads on each individual flip-flop in the multi-bit flop are reduced sufficiently by distributing large load 340 between outputs 308A, 308B.

In certain embodiments, one or more process steps described herein may be performed by one or more processors (e.g., a computer processor) executing instructions stored on a non-transitory computer-readable medium. For example, methodology 90, shown in FIG. 1, or process 400, shown in FIG. 4, may have one or more steps performed by one or more processors executing instructions stored as program instructions in a computer readable storage medium (e.g., a non-transitory computer readable storage medium).

Figure 10:
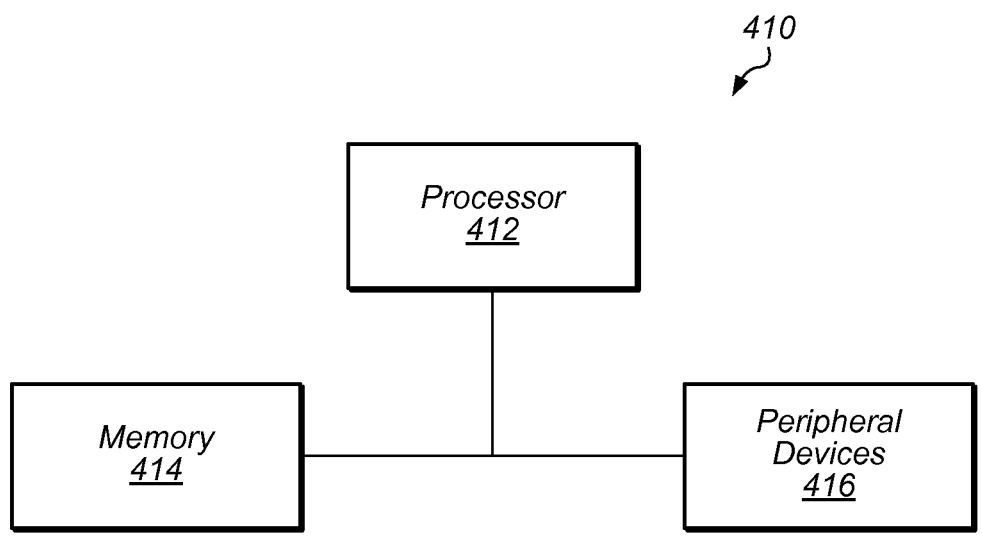
FIG. 10 depicts a block diagram of one embodiment of an exemplary computer system.

FIG. 10 depicts a block diagram of one embodiment of exemplary computer system 410. Exemplary computer system 410 may be used to implement one or more embodiments described herein. In some embodiments, computer system 410 is operable by a user to implement one or more embodiments described herein methodology 90, shown in FIG. 1, or process 400, shown in FIG. 4. In the embodiment of FIG. 10, computer system 410 includes processor 412, memory 414, and various peripheral devices 416. Processor 412 is coupled to memory 414 and peripheral devices 416. Processor 412 is configured to execute instructions, including the instructions for methodology 90 or process 400, which may be in software. In various embodiments, processor 412 may implement any desired instruction set (e.g. Intel Architecture-32 (IA-32, also known as x86), IA-32 with 64 bit extensions, x86-64, PowerPC, Sparc, MIPS, ARM, IA-64, etc.). In some embodiments, computer system 410 may include more than one processor. Moreover, processor 412 may include one or more processors or one or more processor cores.

Processor 412 may be coupled to memory 414 and peripheral devices 416 in any desired fashion. For example, in some embodiments, processor 412 may be coupled to memory 414 and/or peripheral devices 416 via various interconnect. Alternatively or in addition, one or more bridge chips may be used to coupled processor 412, memory 414, and peripheral devices 416.

Memory 414 may comprise any type of memory system. For example, memory 414 may comprise DRAM, and more particularly double data rate (DDR) SDRAM, RDRAM, etc. A memory controller may be included to interface to memory 414, and/or processor 412 may include a memory controller. Memory 414 may store the instructions to be executed by processor 412 during use, data to be operated upon by the processor during use, etc.

Figure 11:
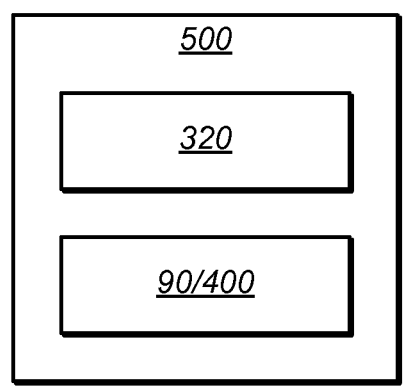
FIG. 11 depicts a block diagram of one embodiment of a computer accessible storage medium.

Peripheral devices 416 may represent any sort of hardware devices that may be included in computer system 410 or coupled thereto (e.g. storage devices, optionally including computer accessible storage medium 500, shown in FIG. 11, other input/output (I/O) devices such as video hardware, audio hardware, user interface devices, networking hardware, etc.).

Turning now to FIG. 11, a block diagram of one embodiment of computer accessible storage medium 500 including one or more data structures representative of multi-bit flops 320 (depicted in FIGS. 5, 6, 7, and 9) included in an integrated circuit design and one or more code sequences representative of methodology 90 (depicted in FIG. 1) or process 400 (depicted in FIG. 4) is shown. Each code sequence may include one or more instructions, which when executed by a processor in a computer, implement the operations described for the corresponding code sequence. Generally speaking, a computer accessible storage medium may include any storage media accessible by a computer during use to provide instructions and/or data to the computer. For example, a computer accessible storage medium may include non-transitory storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory.

The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB). Generally, computer accessible storage medium 500 may store data in a non-transitory manner, where non-transitory in this context may refer to not transmitting the instructions/data on a signal. For example, non-transitory storage may be volatile (and may lose the stored instructions/data in response to a power down) or non-volatile.

Further modifications and alternative embodiments of various aspects of the embodiments described in this disclosure will be apparent to those skilled in the art in view of this description. Accordingly, this description is to be construed as illustrative only and is for the purpose of teaching those skilled in the art the general manner of carrying out the embodiments. It is to be understood that the forms of the embodiments shown and described herein are to be taken as the presently preferred embodiments. Elements and materials may be substituted for those illustrated and described herein, parts and processes may be reversed, and certain features of the embodiments may be utilized independently, all as would be apparent to one skilled in the art after having the benefit of this description. Changes may be made in the elements described herein without departing from the spirit and scope of the following claims.

What is claimed is:

1. A method, comprising:
   assessing, by one or more processors, one or more timing slack properties of input pins and output pins on each bit in a plurality of multi-bit clocked storage devices utilized in a design for an integrated circuit, wherein the plurality of multi-bit clocked storage devices comprise a common logical clock input;
   assigning, by the one or more processors, based on the assessed timing slack properties of the bits, each of the bits to one bit group selected from a plurality of bit groups;
   remapping, by the one or more processors, the bits within the plurality of multi-bit clocked storage devices such that at least one of the multi-bit clocked storage devices comprises two or more bits selected from one bit group; and
   applying one or more timing corrections to one or more of the multi-bit clocked storage devices, wherein at least one timing correction is applied to the at least one multi-bit clocked storage device that comprises the two or more bits selected from the one bit group.

2. The method of claim 1, wherein the one or more timing slack properties comprise a negative or positive timing slack and a relative magnitude of the timing slack.

3. The method of claim 1, wherein the at least one timing correction comprises clock skewing of the at least one multi-bit clocked storage device.

4. The method of claim 1, wherein the at least one timing correction comprises resizing the at least one multi-bit clocked storage device.

5. The method of claim 1, further comprising sorting, by the one or more processors based on the assessed timing slack properties of the bits, the bits into a selected order determined by at least one of the assessed timing slack properties, and assigning each of the bits to the one bit group selected from the plurality of bit groups.

6. The method of claim 5, wherein the plurality of bit groups is formed by dividing the sorted bits into a plurality of groups.

7. The method of claim 1, wherein at least one bit group selected from the plurality of bit groups comprises at least one common timing slack property among the bits assigned to the bit group.

8. The method of claim 7, wherein the common timing slack property comprises a timing slack property that is the same or is closest to being the same among the assessed timing slack properties of the bits.

9. The method of claim 1, wherein the at least one multi-bit clocked storage device that comprises the two or more bits selected from the one bit group comprises at least one common timing slack property among the two or more bits.

10. The method of claim 1, wherein the multi-bit clocked storage devices comprise at least one of a multi-bit flip-flop, a multi-bit latch, and a multi-bit register.

11. A non-transitory computer accessible storage medium including instructions that, when executed by one or more processors, cause the one or more processors to perform a method, comprising:
    assessing one or more timing slack properties of input pins and output pins on individual flip-flops in a plurality of multi-bit flip-flops utilized in a design for an integrated circuit, wherein the plurality of multi-bit flops comprise a common logical clock input;
    sorting, based on at least one of the assessed timing slack properties of the individual flip-flops, the individual flip-flops into a selected order;
    remapping the individual flip-flops to the plurality of multi-bit flip-flops, wherein the individual flip-flops are remapped to the plurality of multi-bit flip-flops based on the selected order; and
    applying one or more timing corrections to one or more of the multi-bit flip-flops, wherein at least one timing correction is applied to at least one of the multi-bit flip-flops that comprises individual flip-flops remapped to the at least one multi-bit flip-flop.

12. The computer accessible storage medium of claim 11, wherein the one or more timing slack properties comprise a negative or positive timing slack and a relative magnitude of the timing slack.

13. The computer accessible storage medium of claim 11, wherein applying the at least one timing correction comprises applying clock skewing to the individual flip-flops remapped to the at least one multi-bit flip-flop.

14. The computer accessible storage medium of claim 11, wherein applying the at least one timing correction comprises resizing the at least one multi-bit flip-flop with the remapped individual flip-flops.

15. The computer accessible storage medium of claim 11, wherein sorting the individual flip-flops into the selected order comprises sorting the individual flip-flops such that adjacent individual flip-flops in the selected order have a related timing slack property.

16. The computer accessible storage medium of claim 15, wherein the related timing slack property comprises a timing slack property that is the same or is closest to being the same among the assessed timing slack properties of the individual flip-flops.

17. The computer accessible storage medium of claim 11, wherein each multi-bit flip-flop that comprises remapped individual flip-flops comprises at least one common timing slack property among the remapped individual flip-flops.

18. The computer accessible storage medium of claim 17, wherein the common timing slack property comprises a timing slack property that is the same or is closest to being the same among the assessed timing slack properties of the individual flip-flops.

19. The computer accessible storage medium of claim 11, wherein the individual flip-flops sorted in the selected order comprise individual flip-flops within a pre-determined placement radius in the design for the integrated circuit.

20. The computer accessible storage medium of claim 11, further comprising providing a load from at least one of the multi-bit flops, wherein the load is divided among the individual flip-flops remapped to the at least one multi-bit flop.

\* \* \* \* \*